US006738922B1

(12) United States Patent
Warwar et al.

(10) Patent No.: US 6,738,922 B1
(45) Date of Patent: May 18, 2004

(54) CLOCK RECOVERY UNIT WHICH USES A DETECTED FREQUENCY DIFFERENCE SIGNAL TO HELP ESTABLISH PHASE LOCK BETWEEN A TRANSMITTED DATA SIGNAL AND A RECOVERED CLOCK SIGNAL

(75) Inventors: Greg Warwar, Santa Paula, CA (US); Tim Coe, Oxnard, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 597 days.

(21) Appl. No.: 09/680,679

(22) Filed: Oct. 6, 2000

(51) Int. Cl.[7] .................................................. G06F 1/04
(52) U.S. Cl. .......................... 713/503; 713/500; 713/501
(58) Field of Search ................................ 713/500, 501, 713/502, 503; 327/2, 3, 156, 158, 231, 237, 241

(56) References Cited

U.S. PATENT DOCUMENTS

| 4,868,514 A | | 9/1989 | Azevedo et al. ............. 328/155 |
| 4,918,406 A | | 4/1990 | Baumbach et al. ...... 331/117 R |
| 5,043,596 A | | 8/1991 | Masuda et al. .............. 307/262 |
| 5,451,894 A | * | 9/1995 | Guo ........................... 327/241 |
| 5,619,148 A | * | 4/1997 | Guo ............................... 327/3 |
| 5,621,774 A | | 4/1997 | Ishibashi et al. ............ 375/371 |
| 5,841,323 A | * | 11/1998 | Fujimoto ...................... 331/11 |
| 5,872,959 A | | 2/1999 | Nguyen et al. ............. 395/552 |
| 6,157,690 A | * | 12/2000 | Yoneda ....................... 375/376 |
| 6,167,077 A | | 12/2000 | Ducaroir et al. ............ 375/219 |
| 6,292,040 B1 | * | 9/2001 | Iwamoto et al. ............ 327/158 |
| 6,560,053 B1 | * | 5/2003 | Ohta et al. ..................... 360/51 |

FOREIGN PATENT DOCUMENTS

JP       2000357964 A  * 12/2000   ........... H03L/7/087

OTHER PUBLICATIONS

"High Resolution Digital Phase–Locked Logic Circuit", IBM Technical Disclosure Bulletin, Apr. 1, 1994, US, pp. 659–662.*

Chen, et al., "A 1.25 Gb/s, 460m W CMOS Transceiver for Serial Data Communication," IEEE International Solid–State Circuits Conference, ISSCC97, Session 15, Serial Data Communications, Paper FP 15.3, pp. 242–243, and 465, 1997.

Fiedler, et al., "A 1.0625Gbps Transceiver with 2x–Oversampling and Transmit Signal Pre–Emphasis," IEEE International Solid–State Circuits Conference, ISSCC97, Session 15, Serial Data Communications, Paper FP 15.1, pp. 238–239, and 464, 1997.

* cited by examiner

*Primary Examiner*—Thomas Lee
*Assistant Examiner*—Paul Yanchus, III
(74) *Attorney, Agent, or Firm*—Christie, Parker & Hale, LLP (57) ABSTRACT

A clock recovery unit is used to recover a clock signal from a transmitted data signal. The clock recovery unit includes a phase locked loop (PLL) circuit and a frequency detection circuit. The frequency detection circuit includes a digital phase tracking circuit (DPTC), which uses a rotational phase shifter to shift phase of a variable clock signal from a voltage controlled oscillator in the PLL circuit, in discrete amounts from 0 to 360 degrees, depending on a digital input code provided by a digital accumulator, which receives up or down count signals from a phase comparator. The shifted variable clock signal is provided to a phase/frequency detector, which provides an output to a glitch suppressor to suppress small phase differences prior to providing the output to the PLL circuit. When the frequency difference between the variable clock signal and the reference clock signal is large, the phase/frequency detector drives the frequency in the correct direction. When the frequency difference is small, the DPTC keeps the phase of the shifted variable clock signal aligned to the phase of the reference clock signal.

40 Claims, 6 Drawing Sheets

CLOCK RECOVERY UNIT WHICH USES A DETECTED FREQUENCY DIFFERENCE SIGNAL TO HELP ESTABLISH PHASE LOCK BETWEEN A TRANSMITTED DATA SIGNAL AND A RECOVERED CLOCK SIGNAL

BACKGROUND OF THE INVENTION

The present invention relates generally to a clock recovery unit, and more particularly, to a method and apparatus for recovering a clock signal from a transmitted data signal using a clock recovery unit (CRU) that includes a frequency detector.

Data transmission systems generally transmit clocked data. Receiver units generally must determine the clock, both in frequency and in phase, used to generate the clocked data. A clock recovery unit (CRU) based on a phase locked loop (PLL) circuit is typically used to recover a corresponding clock signal from a transmitted data signal. In a PLL circuit, a feedback loop is generally used to adjust a variable clock signal output of a voltage-controlled oscillator (VCO) until the variable clock signal aligns with the transmitted data signal. The variable clock signal aligned with the transmitted data signal is used as a recovered clock signal that corresponds to the transmitted data signal. In other words, the output of the VCO is the recovered clock signal.

The PLL circuit typically includes a phase detector to detect a phase difference between the transmitted data signal and the variable clock signal. The phase difference is used to adjust the output frequency of the VCO to align the variable clock signal to the transmitted data signal, both in phase and in frequency.

Since the recovered clock signal behaves in a periodic manner, when the phase difference between the transmitted data signal and the recovered clock signal becomes too large, the output signal of the phase detector may "wrap around" to a new value. For example, if the phase detector is capable of generating a phase difference signal representing a phase difference in the range of −180 degrees to +180 degrees, the output signal of the phase detector will increase as the phase difference between the transmitted data signal and the recovered clock signal increases up to +180 degrees.

When the phase difference increases further to more than +180 degrees, the phase detector is typically unable to generate a phase difference signal to represent a phase difference of more than +180 degrees. Instead, a phase wrapping occurs at approximately +180 degrees, and the phase detector generates a phase difference signal that represents a phase difference of approximately −180 degrees. This phase wrapping causes a problem of phase ambiguity around the maximum and minimum phase differences of +180 degrees and −180 degrees, respectively.

The phase wrapping generally does not present a problem once the PLL circuit is locked to the transmitted data signal. This is because the PLL circuit generally holds the phase difference to a very small value close to zero degree, in which case phase wrapping typically does not occur. However, the phase wrapping may present a serious problem before the PLL circuit locks. The PLL circuit may not even be able to lock because of the phase wrapping problem. When phase wrapping occurs, the phase difference signal generated by the phase detector may switch back and forth between nearly maximum and nearly minimum values, and the phase locked loop may not be able to adjust the VCO to generate the variable clock signal with correct frequency.

One solution is use of a narrow band voltage controlled oscillator (VCO) that has a tuning range of approximately 1% or less. This limitation in the tuning range typically limits the frequency difference between a data signal and an oscillation frequency of the VCO to be very small. With such small frequency differences, phase wrapping typically does not occur very often, and the PLL circuit generally is able to lock. While this solution is typically effective when a narrow band VCO is used, it is usually impractical since the tuning range of a VCO is generally much larger than 1% of the frequency.

Therefore, a need exists for a clock recovery unit that can solve the wrap around problem while its VCO tuning range is sufficiently large as to be practical for applications using IC designs.

SUMMARY OF THE INVENTION

The present invention provides a clock recovery unit (CRU) for recovering a corresponding clock signal from a transmitted data signal. The CRU includes a frequency detection circuit and a phase locked loop (PLL) circuit to detect phase and frequency differences between a reference clock signal and a variable clock signal, and to adjust the variable clock frequency to recover a clock signal that corresponds to the transmitted data signal.

In one embodiment the present invention comprises a clock recovery unit. The clock recovery unit includes a phase locked loop to receive a transmitted data signal and to generate an output clock signal. The clock recovery unit further comprises a frequency detection circuit to receive the output clock signal and a reference clock signal, and to generate an output signal to provide to the phase locked loop, with the phase locked loop using the output signal to establish a phase lock between the transmitted data signal and the output clock signal. In a further embodiment, the clock recovery unit includes a phase difference signal which is proportional to the phase difference between a reference clock signal and a shifted output clock signal, with a frequency detection circuit including a glitch suppressor to suppress the phase difference signal when the width of the phase difference signal is substantially narrow.

These and other aspects of the present invention may be more fully understood through reference to the following detailed description with reference to the accompanying drawings.

In the following embodiments of the invention, common reference numerals are used, when appropriate, to represent similar components.

DETAILED DESCRIPTION

Figure 1:
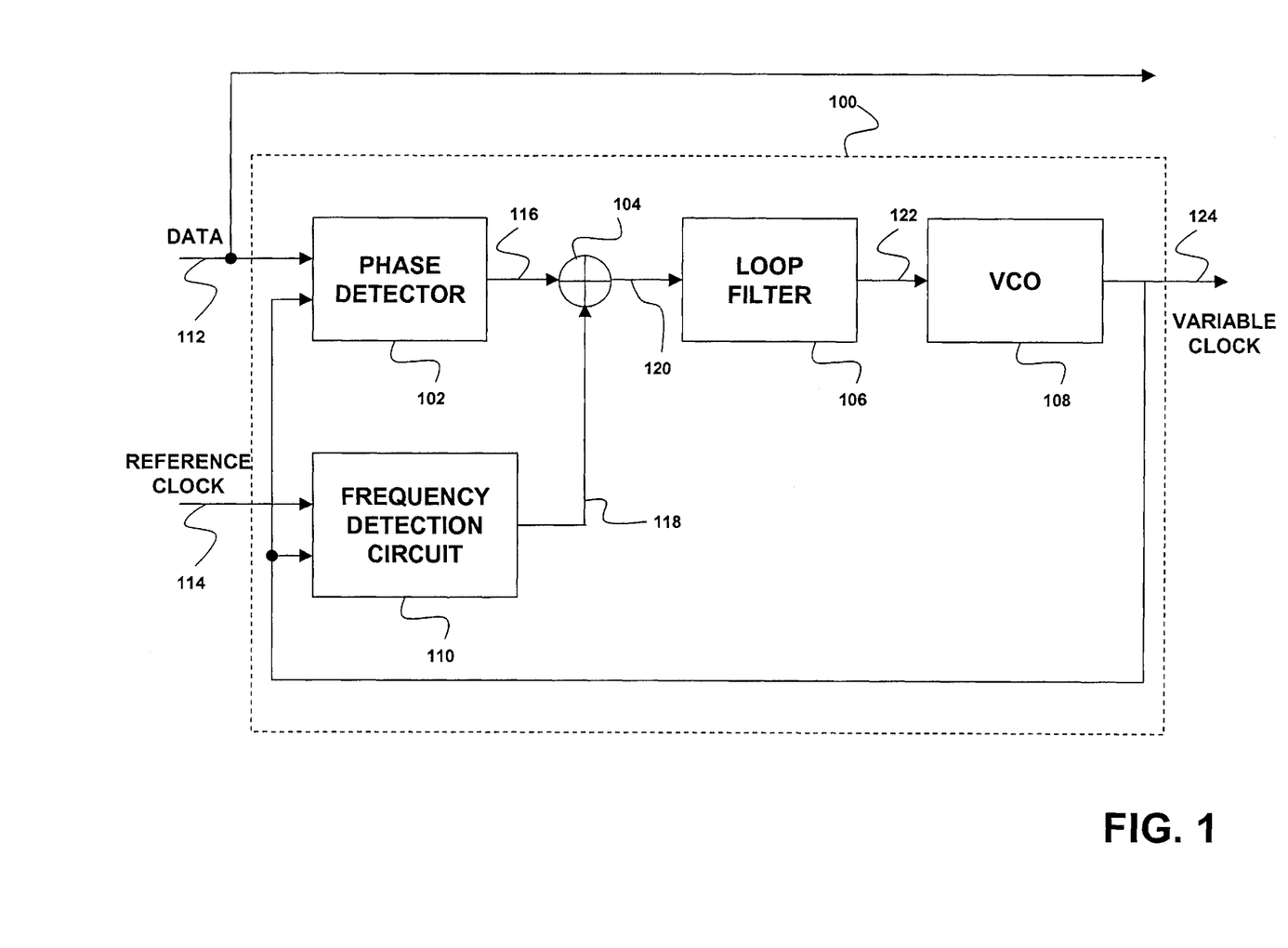
FIG. 1 is a block diagram of a CRU including a frequency detection circuit in one embodiment of the present invention.

FIG. 1 is a block diagram of a clock recovery unit (CRU) 100 in accordance with one embodiment of the present invention. The CRU has a phase detector 102, a summer 104, a loop filter 106, and a voltage controlled oscillator (VCO) 108, all of which function as a phase locked loop (PLL). A transmitted data signal, known to have a data rate approximate a known frequency, is provided to the phase detector. The phase detector detects the amount by which the phase of the recovered clock signal leads or lags the phase of the transmitted data signal. In the embodiment described, the phase detector receives the transmitted data signal 112 and the variable clock signal 124, and generates a phase difference signal 116. The phase difference signal 116 is proportional to the difference in phase between the transmitted data signal 112 and the output clock signal 124.

The CRU also includes a frequency detection circuit 110. A reference clock signal 114 is provided to the frequency detection circuit. The frequency of the reference clock signal is approximate the frequency of the data rate of the data signal. The frequency detection circuit also receives the output clock signal, and performs a comparison of the two signals. The frequency detector forms a frequency difference signal based on the comparison of the two signals. However, the frequency difference signal 118 is not generated when the frequency detection circuit is suppressed or when the phase and frequency difference between the reference clock signal 114 and the variable clock signal is sufficiently small.

The phase difference signal 116 is summed with the frequency difference signal 118 of frequency detection circuit 110 by the summer 104 to generate a combined difference signal 120. The combined difference signal is provided to the loop filter 106 to be low pass filtered. The loop filter provides a filtered phase difference signal 122 to the VCO. The filtered phase difference signal is used to control an oscillation frequency of the VCO. The VCO provides the output clock signal 124 as an output of the PLL circuit 300. The phase detector 102 continuously detects the phase differences between the transmitted data signal 112 and the output clock signal 124, and the VCO 108 continually adjusts the oscillation frequency of the output clock signal using the detected phase difference.

In one embodiment, the frequency detection circuit is switched off by a higher level control circuit (not shown) when the frequency difference signal is small. The phase detector 102, the loop filter 106 and the VCO 108 thereafter operate as a typical phase locked loop (PLL) circuit. When the frequency of the variable clock signal is sufficiently far apart from the frequency of the reference clock, the control circuit switches the frequency detection circuit back on. The control circuit also detects whether the phase locked loop of the CRU is locked.

Figure 2:
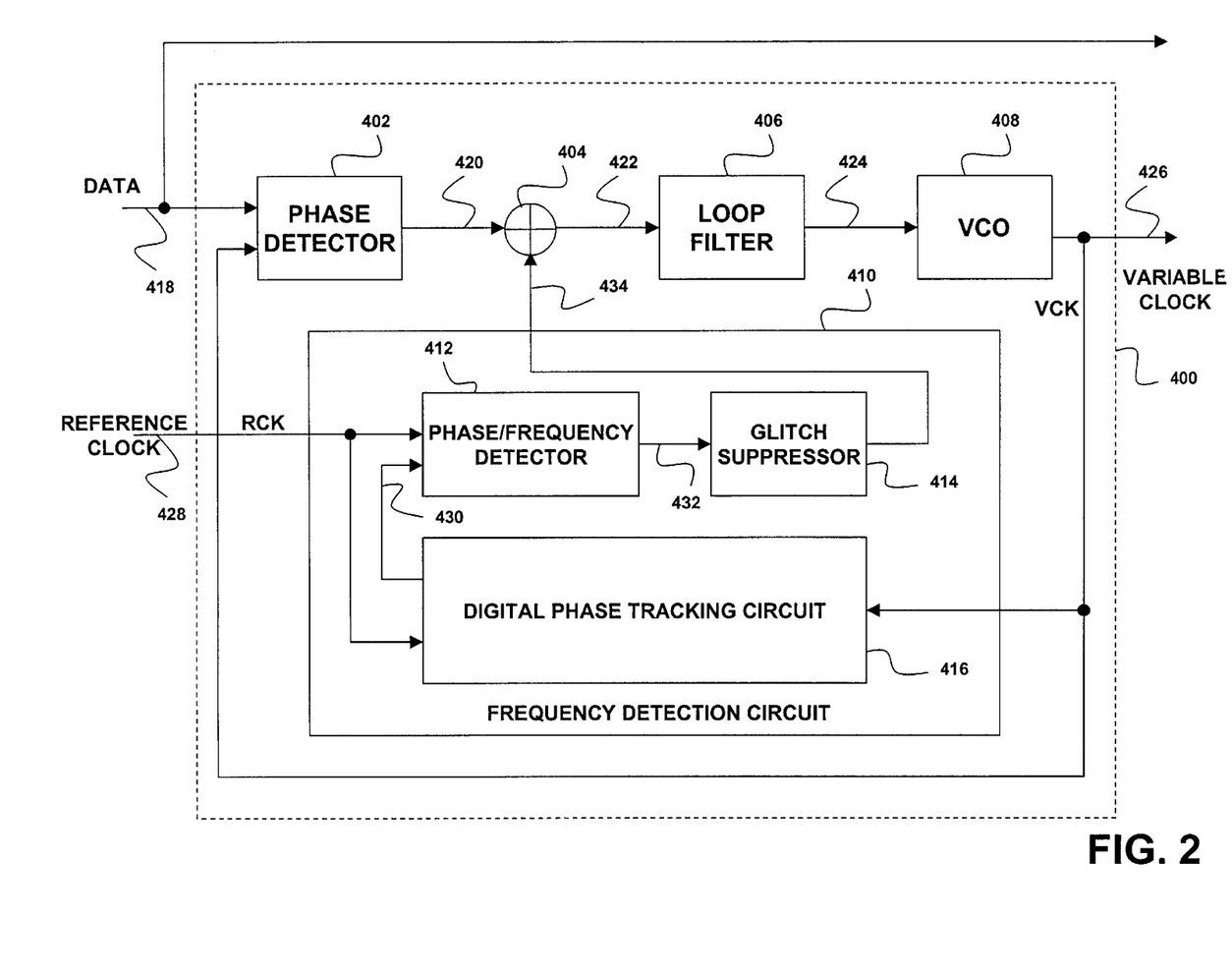
FIG. 2 is a Bock diagram of a phase/frequency detector used in one embodiment of the CRU in FIG. 1.

FIG. 2 illustrates a block diagram of a clock recovery unit (CRU) 400 in accordance with another embodiment of the present invention. The CRU 400 includes a phase detector 402, a summer 404, a loop filter 406, a VCO 408 and a frequency detection circuit 410. The frequency detection circuit 410 includes a phase/frequency detector 412, a glitch suppressor 414 and a digital phase tracking circuit (DPTC) 416. In the embodiment of FIG. 2 the frequency detection circuit is not controlled by an external control circuit. Instead, when the frequency indicated by the frequency detector is approximate the appropriate frequency the output of the frequency detector is held constant through the use of the glitch suppressor. In addition, the frequency detection circuit includes circuitry to reduce phase wrapping by slowing the response of the frequency detection circuit.

The CRU receives a data signal 418 and a reference clock a signal 428, and generates an output clock signal 426. The phase detector receives the data signal and the output clock signal and generates a phase difference signal 420. The summer sums the phase difference signal and the frequency difference signal 434 generated by the frequency detection circuit to generate a combined difference signal 422. The loop filter 406 filters the combined difference signal and provides the filtered phase difference signal to the VCO as a control voltage signal 424. The VCO generates the output clock signal based on the filtered phase difference signal. The VCO is therefore driven with a signal that is the sum of the output of the phase detector and the output of frequency detection circuit.

In the frequency detection circuit, the phase/frequency detector compares a reference clock signal with a clock signal generated by the digital phase tracking circuit (DPTC). Phase/frequency detector circuits for comparing two clock signals are well known in the art, and such circuits generate signals indicating that an increase or a decrease in clock frequency is desired. Thus, the phase/frequency detector compares the reference clock signal 428 and the output clock signal and provides a frequency difference signal 432 to the glitch suppressor 414. The glitch suppressor determines if the frequency difference signal is small enough to be suppressed. If the frequency difference signal is small, the glitch suppressor suppresses the frequency difference signal so that the frequency difference signal 434 substantially disappears. Thus, in this embodiment, the frequency detection circuit is not switched on and off. Instead, the glitch suppressor suppresses the frequency difference signal when the frequency difference signal is small.

The clock signal generated by DPTC is a phase shifted version of the output clock signal generated by the VCO. The amount of phase shift provided by the DPTC is determined based on a comparison of the reference clock signal and the output clock signal. Accordingly, the DPTC receives as inputs both the reference clock signal and the output clock signal.

Figure 3:
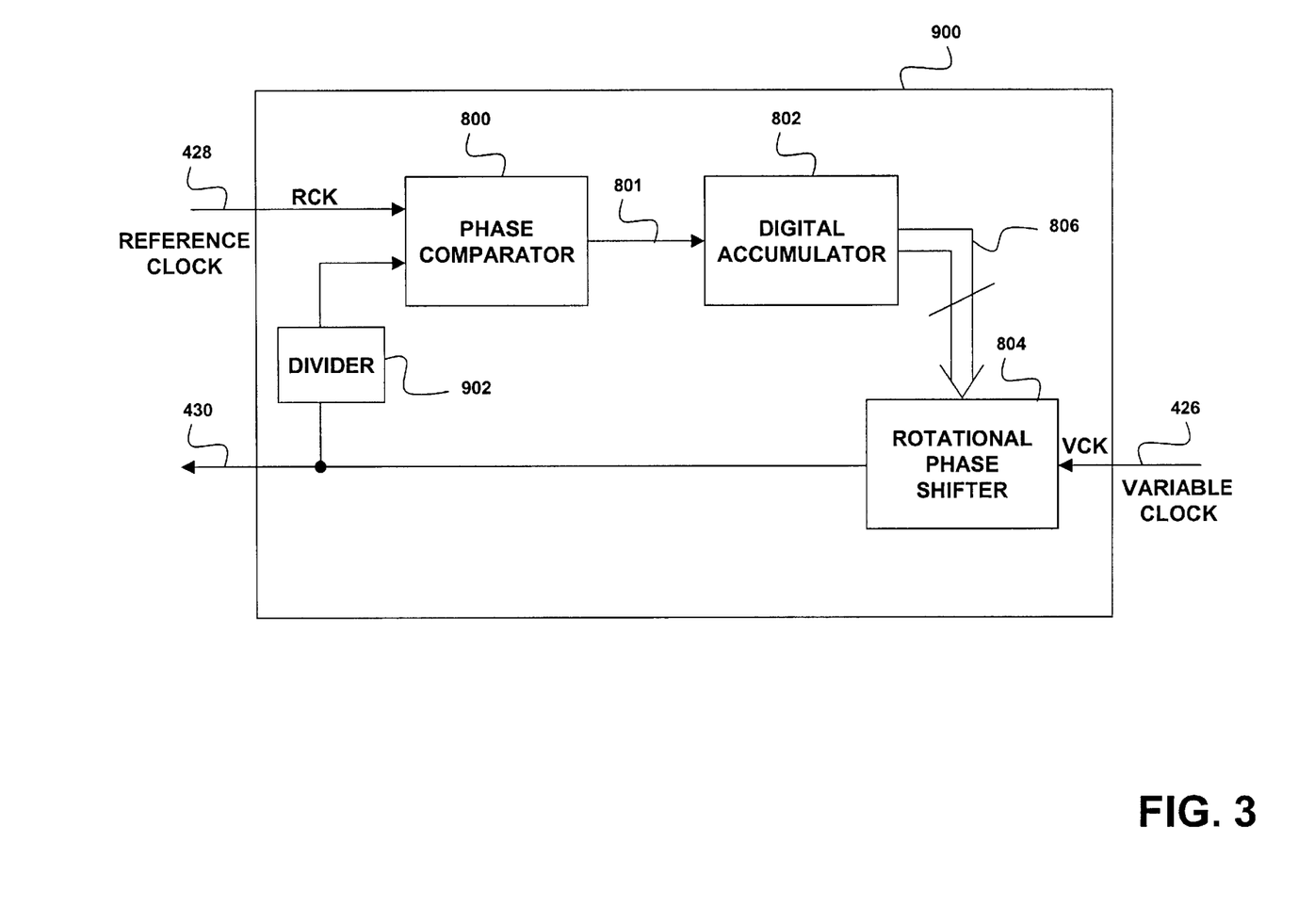
FIG. 3 is a lock diagram of one embodiment of a digital phase tracking circuit (DPTC) in FIG. 1.

FIG. 3 is a block diagram of the digital phase tracking circuit (DPTC) 416 in one embodiment of the present invention. The DPTC 416 includes a phase comparator 800, a digital accumulator 802 and a rotational phase shifter 804. The phase comparator, the digital accumulator and the rotational phase shifter form a loop that attempts to shift the phase of a clock signal 426 to align to the phase of the reference clock signal 428.

The rotational phase shifter 804 shifts the phase of the clock signal 426. The clock signal 426 is shifted in discrete amounts from 0 to 360 degrees, depending on digital input code bus signals 806 provided by the digital accumulator 802. The rotational phase shifter 804 provides a shifted clock signal 430 to a divider 902, which provides a scaled version of the shifted clock signal to the phase comparator 800. The use of the divider serves two primary purposes. First, slowing down the frequency of the shifted clock signal allows for use of a slower reference clock signal, which allows for a slower phase comparator and digital accumulator circuitry. In addition, the use of the divider serves to slow the response of the frequency detector, thereby increasing system stability and minimizing phase wrapping.

The phase comparator outputs a digital logic value output 801, which has a value of 0 or 1 based on the phase difference between the reference clock signal 428 and the shifted variable clock signal 430. If the phase of the reference clock signal leads the phase of the shifted output clock signal, the digital logic value output is 1, indicating a need for the shifted variable clock signal to speed up. On the other hand, if the phase of the reference clock signal lags behind the phase of the shifted variable clock signal, the digital logic value output is 0, indicating a need for the shifted variable clock signal to slow down.

The digital logic value output of the phase comparator is provided to the digital accumulator. The digital accumulator interprets digital logic values of 0 and 1 as codes for "count down by 1" and "count up by 1," respectively. The most significant bits (MSBs) of the digital accumulator 802 are provided as the digital input code bus signals 806 to the rotational phase shifter 804. The number of MSBs provided depend on the number of states of the rotational phase shifter 804. For example, if the rotational phase shifter 804 has 32 states, at least five MSBs are preferably provided since five bits may be used to represent 32 ($2^5$) states.

The DPTC 416, in this embodiment, has a small maximum rate at which it can phase shift the variable clock signal 426 to generate the shifted variable clock signal 430. This maximum rate of phase shift is controlled by the number of bits in the digital accumulator. For example, if four least significant bits (LSBs) from the digital accumulator 802 are dropped when providing the MSBs as the digital input code bus signals 806, the accumulator 802 typically counts up at least 16 ($2^4$) times before the digital input code increments by 1. The phase comparator 800 performs only one comparison per reference clock cycle. Thus, it takes at least 16 reference clock cycles to shift the phase of the shifted variable clock signal 430 by an additional state. Therefore, if there are 32 states in the rotational phase shifter, it would take a minimum of 16 reference clock cycles to phase shift the shifted variable clock signal by approximately 11.25 (360/32) degrees.

Figure 4:
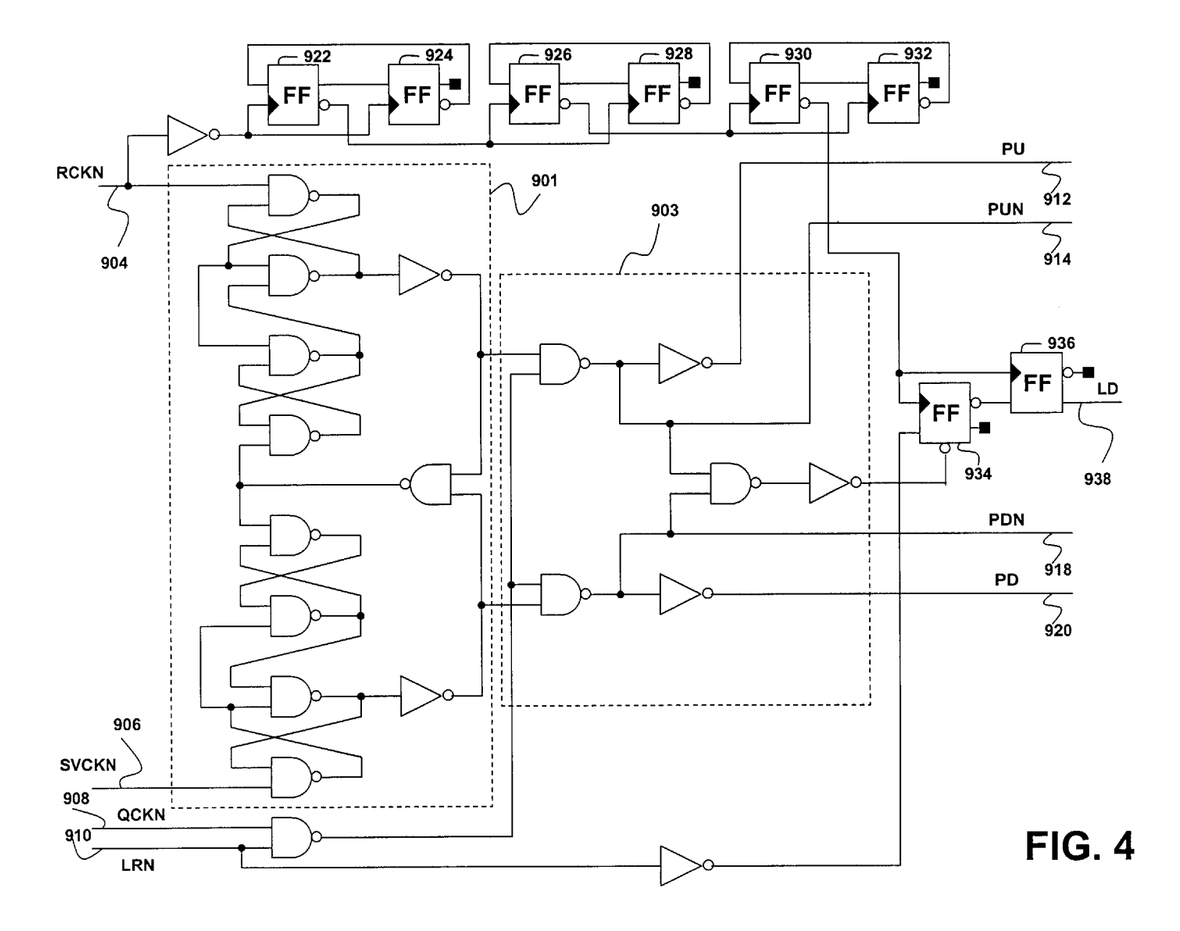
FIG. 4 is a circuit diagram of a phase/frequency detector coupled to a glitch suppressor in one embodiment of the present invention.

FIG. 4 is a circuit diagram of one embodiment of a phase/frequency detector 901 and a glitch suppressor 903 which may be similar to the phase/frequency detector 412 and the glitch suppressor 414 of FIG. 2. The phase/frequency detector 901 compares an inverted reference clock signal (rckn) 904 to an inverted shifted variable clock signal (svckn) 906, and provides outputs to the glitch suppressor 903. The glitch suppressor also receives an inverted quad clock signal qckn 908 NAND' ed with an inverted LR signal LRN 910. The glitch suppressor generates a pump up signal PU 912 and an inverted pump up signal PUN 914 as well as inverted pump down and pump down signals PDN 918 and PD 920.

The LRN signal 910 is also provided to a flip flop 934 through an inverter as an LR signal. The flip flop 934 also receives an output of a flip flop 930 as a clock signal. Flip flops 922, 924, 926, 928, 930 and 932 preferably are coupled in such a way as to divide the frequency of the rckn signal 904 by eight, by the time the flip flop 934 receives the output of the flip flop 930. The output of the flip flop 930 is also provided as a clock signal to a flip flop 936. The flip flop 936 receives 30 an inverted output of the flip flop 934 and provides an LD signal 938. The flip flops 934 and 936 operate as an out-of-lock generator, which is used to provide the LD signal 938 to indicate a lock/out-of-lock status of the clock recovery unit 700.

The PU and PUN signals 912 and 914 are differential pump up 35 pulses provided when the frequency of the svckn 906 is lower than the frequency of the rckn 904. The PD and PDN signals 918 and 920 are pump down pulses provided when the frequency of the svckn 906 is higher than the frequency of the rckn 904.

Figure 5:
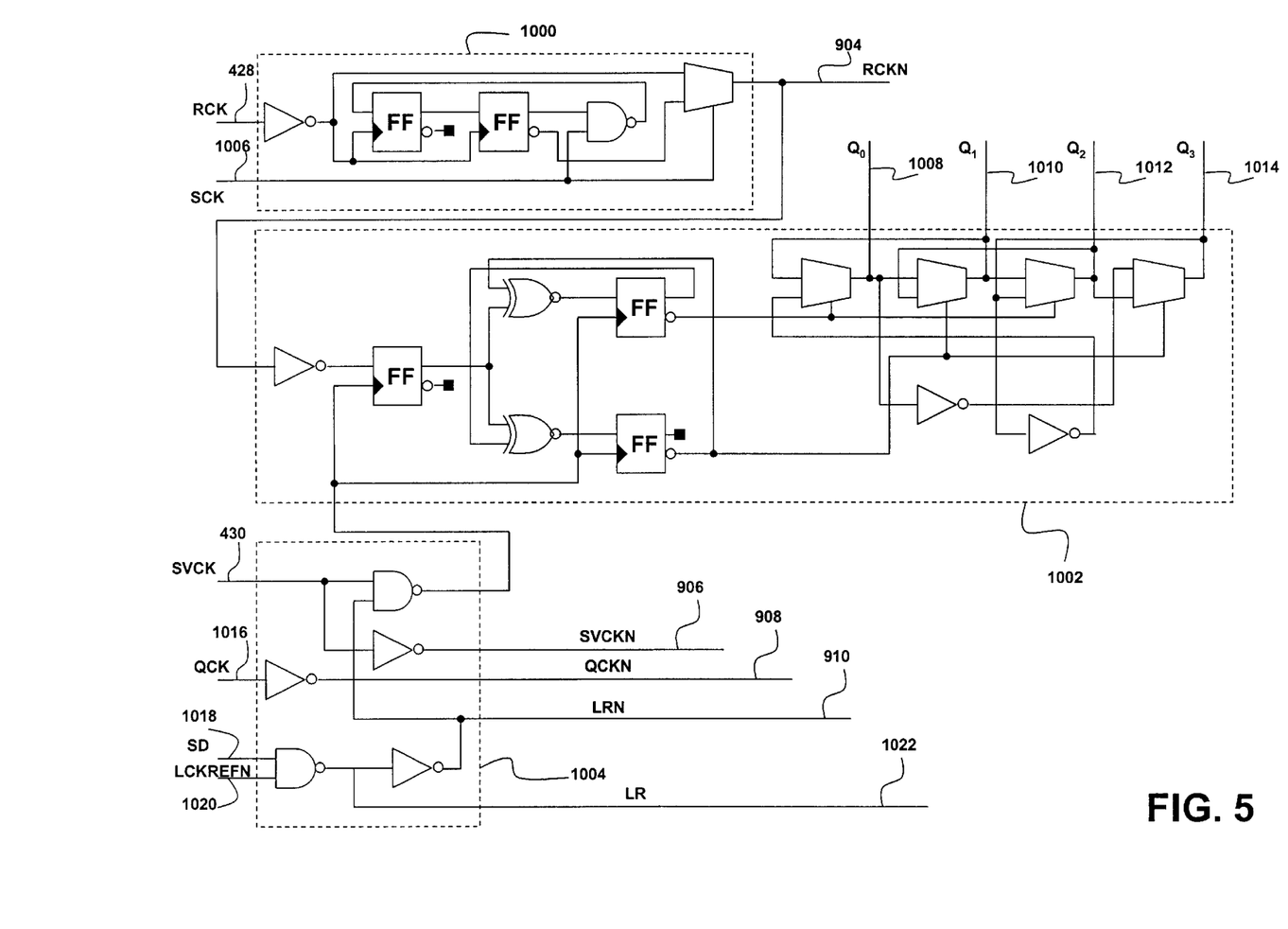
FIG. 5 is a circuit diagram of a phase comparator in one embodiment of the present invention.

FIG. 5 is a circuit diagram of a phase comparator 1002 in one embodiment of the present invention. The phase comparator 1002 is coupled to a rckn generator 1000 and an LR signal generator 1004. The rckn generator 1000 receives a reference clock signal 428 and an sck signal 1006 and provides an inverted reference clock signal 904, which is received by the phase/frequency detector 901 of FIG. 4. The LR signal generator 1004 receives a shifted variable clock (svck) signal 430, a quad clock (qck) signal 1016, an SD signal 1018 and an LCKREFN signal 1020. The LR signal generator 1004 provides an inverted shifted variable clock (svckn) signal 906, an inverted quad clock (qckn) clock signal 908 and an inverted LR (LRN) signal 910, which are provided to the phase/frequency detector 901 of FIG. 3. The LR signal generator 1004 also generates an LR signal 1022.

The phase comparator 1002 receives an output from the LR signal generator 1022 and the rckn signal 904 from the rckn signal generator 1000, and generates output signals $Q_0$ 1008, $Q_1$ 1010, $Q_2$ 1012 and $Q_3$ 1014. These output signals are provided to a digital accumulator, such as the digital accumulator 802 of FIG. 6.

Figure 6:
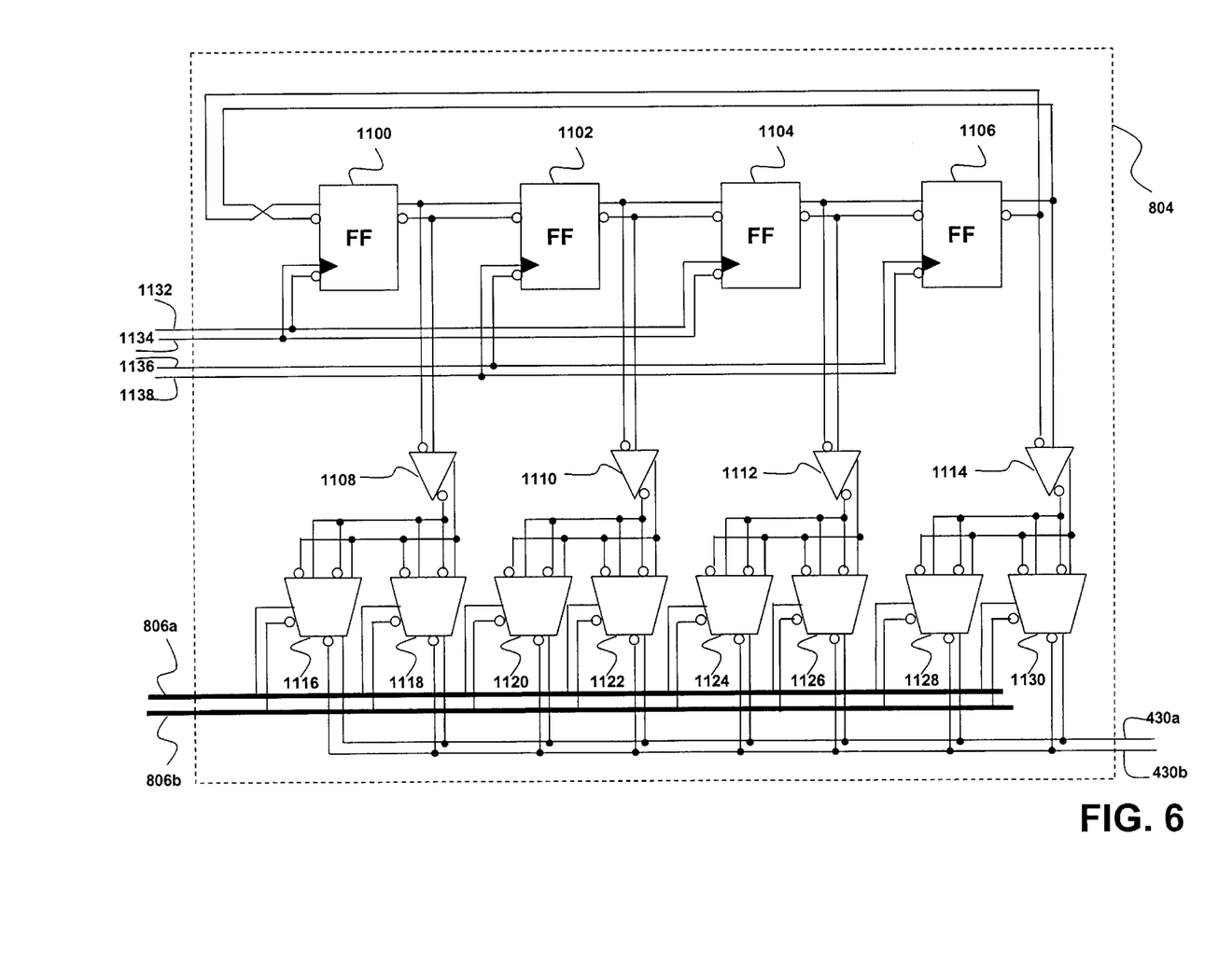
FIG. 6 is a circuit diagram of a rotational phase shifter in one embodiment of the present invention.

FIG. 6 is a circuit diagram of a rotational phase shifter 804 in one embodiment of the present invention. The signals illustrated in FIG. 10 are differential signals, however, those with ordinary skill in the art would appreciate that the signals may be implemented as single-ended signals. In addition, number of components in the rotational phase shifter may be more or less in other embodiments. For example, the number of flip flops in other embodiments may be more or less than four shown in FIG. 6.

The rotational phase shifter 804 in FIG. 6 includes flip flops 1100, 1102, 1104 and 1106. The flip flops 1100 and 1104 receive a differential pair of clock signals, an inverted clock signal 1132 and a non-inverted clock signal 1134. The flip flops 1102 and 1106 receive a differential pair of clock signals, an inverted clock signal 1136 and a non-inverted positive clock signal 1138. In this embodiment, the differential pair of clock signals 1132, 1134 and the differential pair of clock signals 1136, 1138 have substantially the same clock frequency, but they are not aligned in phase. For example, the clock signals 1132 and 1134 lead the clock signals 1136 and 1138 in phase.

In this embodiment, upon detecting a rising edge of the corresponding non-inverted clock signal, each of the flip flops outputs its content and stores input signals provided at its inputs as new content. In other embodiments, each of the flip flops outputs its content and stores input signals provided at its inputs as new content, upon detecting a rising edge of the corresponding inverted clock signal.

A differential pair of output signals from the flip flop 1100 is provided to the flip flop 1102 as input signals. A differential pair of output signals from the flip flop 1102 is provided to the flip flop 1104 as input signals. A differential pair of output signals from the flip flop 1104 is provided to the flip flop 1106 as input signals. The flip flop 1100 receives a art differential pair of output signals from the flip flop 1106. The output signals from the flip flop 1106 are inverted prior to being provided to the flip flop 1100 as input signals. In other words, a non-inverted output signal of the flip flop 1106 is provided as an inverted input signal of the flip flop 1100, and an inverted output signal of the flip flop 1106 is applied as a non-inverted input signal of the flip flop 1100.

Thus, the output signals from the flip flop 1100 are propagated through the flip flops 1102, 1104, 1106, and then inverted and provided back to the flip flop 1100 as input signals. Since the flip flops 1100, 1102, 1104 and 1106 receive input signals and provide output signals upon detecting a rising edge of the clock signals that have substantially the same frequency and each flip flop provides output signals to the next flip flop as input signals, the output signals of each of the flip flops have substantially the same transition frequency. Further, the transition frequency of each of the flip flops is about half the transition frequency of the input clock signals. In addition, the output signals of the flip flops are offset in phase from each other.

The rotational phase shifter 804 also includes differential inverters 1108, 1110, 1112 and 1114. The output signals of the flip flop 1100, 1102, 1104 and 1106 are provided, respectively, as input signals to the differential inverters 1108, 1110, 1112 and 1114. The differential inverters may be replaced by differential non-inverting drivers in other embodiments since output signals of the differential inverters and the differential non-inverting drivers are substantially identical, except that each differential pair of output signals are inverted.

The rotational phase shifter 804 also includes multiplexers 1116, 1118, 1120, 1122, 1124, 1126, 1128 and 1130. Outputs of the multiplexers are selected by a differential pair of bus signals 806a and 806b. Each of the bus signals 806a and 806b include eight parallel signals. One parallel signal from each bus signals 806a and 806b is tied to one multiplexer, via selection inputs. The non-inverted output signals of the multiplexers are tied together and provides a non-inverted shifted variable clock signal 430a. Likewise, the inverted output signals of the multiplexers are tied together and provides an inverted shifted variable clock signal 430b. In other embodiments, a summer may be used to sum the non-inverted output signals or the inverted output signals together to generate the respective non-inverted shifted variable clock signal 430a or the inverted shifted variable clock signal 430b.

The output signals of the differential inverter 1108 are inverted and provided as input signals to first inputs of the multiplexers 1116 and 1118. The output signals of the differential inverter 1108, without being inverted, are also provided as input signals to second inputs of the multiplexers 1116 and 1118. The output signals of the differential inverter 1110 are inverted and provided as input signals to first inputs of the multiplexers 1120 and 1122. The output signals of the differential inverter 1110, without being inverted, are also provided as input signals to second inputs of the multiplexers 1120 and 1122.

The output signals of the differential inverter 1112 are inverted and provided as input signals to first inputs of the multiplexers 1124 and 1126. The output signals of the differential inverter 1112, without being inverted, are also provided as input signals to second inputs of the multiplexers 1124 and 1126. The output signals of the differential inverter 1114 are inverted and provided as input signals to first inputs of the multiplexors 1128 and 1130. The output signals of the differential inverter 1114, without being inverted, are also provided as input signals to second inputs of the multiplexers 1128 and 1130.

If the selection signals provided to the multiplexers 1116 and 1118 at the selection inputs are identical, e.g., if non-inverted selection signal=0 and inverted selection signal=1 are provided to both the multiplexers 1116 and 1118, the non-inverted output signal of the multiplexer 1116 is substantially in the same frequency and phase as the non-inverted output signal of the multiplexer 1118. Similarly, the inverted output signal of the multiplexers 1116 is substantially in the same frequency and phase as the inverted output signal of the multiplexer 1118.

However, if the selection signals provided to the multiplexers 1116 and 1118 are inverse of one another, e.g., if non-inverted selection signal=0 for the multiplexer 1116 and non-inverted selection signal=1 for the multiplexer 1118, the non-inverted output signals of the multiplexers 1116 and 1118 have substantially the same frequency, but about 180 degrees out of phase from each other. Similarly, the inverted output signals have substantially the same frequency, but about 180 degrees out of phase from one another. The outputs of all the multiplexers having substantially the same frequency but having a phase offset from one another, when tied together as a single signal, produces a resulting signal with a phase that is a combination of the phases of all the output signals added together.

The differential pair of bus signals 806a and 806b in this embodiment are digital input code bus signals provided by a digital accumulator. The digital accumulator either counts up or counts down based on an input signal of logic 1 or logic 0, respectively, from a phase comparator. Since the digital accumulator counts up or counts down only when the phase comparator provides a count up or count down input signal, and since the phase comparator provides the input signal only once per reference clock cycle, the digital accumulator counts up or down only once during each clock cycle of the reference clock signal.

In one embodiment of the present invention, one or more lowest significant bits (LSB's) of the accumulator output are dropped and only the remaining most significant bits (MSBs) are provided as the digital input code bus signals when provided to the rotational phase shifter 804. Since the rotational phase shifter 804 shifts the phase of the output signals only when at least one of the bits of the digital input code bus signals transitions either from zero-to-one or one-to-zero, the number of MSB's used controls the maximum rate at which the phase can be shifted by the rotational phase shifter 804. For example, if the four LSB's from the accumulator are dropped from the digital input code bus signals, the rotational phase shifter is able to shift phase of the output signals only after at least 16 ($2^4$) reference clock cycles. Thus, if the rotational phase shifter 804 has 32 states, then the maximum rate of phase shift would be 11.25 degrees per 16 reference clock cycles.

Accordingly, the clock recovery unit (CRU) of the present invention provides continuous operation and high resolution at the same time, and eliminates a need to switch the frequency detection circuit in and out. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A clock recovery unit comprising:

a phase locked loop receiving a transmitted data signal and generating an output clock signal; and a frequency detection circuit receiving the output clock signal and a reference clock signal, shifting the phase of the output clock signal, dividing the frequency of the shifted output clock signal, and generating a frequency difference signal provided to the phase locked loop circuit, wherein the phase locked loop circuit uses the frequency difference signal to establish a phase lock between the transmitted data signal and the output clock signal.

2. The clock recovery unit of claim 1 wherein the phase locked loop circuit comprises a phase detector which is adapted to compare a phase of the transmitted data signal to a phase of the output clock signal in order to generate a phase difference signal, and wherein the phase locked loop further includes a summer which sums the phase difference signal and the frequency difference signal to generate a combined phase difference signal.

3. The clock recovery unit of claim 2 wherein the frequency detection circuit includes a glitch suppressor, and the frequency difference signal is output from the glitch suppressor.

4. The clock recovery unit of claim 2 wherein the frequency detection circuit includes means for suppressing the frequency difference signal if the frequency difference signal is small.

5. The clock recovery unit of claim 2 wherein the frequency detection circuit comprises a digital phase tracking circuit to shift the output clock signal to generate a shifted variable clock signal.

6. The clock recovery unit of claim 5 wherein the digital phase tracking circuit shifts the output clock signal in discrete steps from 0 to 360 degrees.

7. The clock recovery unit of claim 6 wherein the frequency detection circuit further comprises a phase/frequency detector to compare the reference clock signal to the shifted output clock signal to generate the frequency difference signal.

8. The clock recovery unit of claim 7 wherein the frequency difference signal includes a pulse having a width proportional to the phase difference between the reference clock signal and the shifted output clock signal, and wherein the frequency detection circuit further comprises a glitch suppressor to suppress the frequency difference signal when the width of the frequency difference signal is substantially narrow, and wherein the glitch suppressor generates the frequency difference signal provided to the phase locked loop.

9. The clock recovery unit of claim 6 wherein the digital phase tracking circuit further includes a phase comparator receiving the reference clock signal and a scaled version of the shifted output clock signal, the phase comparator producing a digital logic value output signal, and a digital accumulator to receive the digital logic value output signal, the digital accumulator counting down when the digital logic value output signal has a value of 0 and counting up when the digital logic value output signal has a value of 1, wherein the digital accumulator provides digital input code bus signals, which include at least some of a content of the digital accumulator.

10. The clock recovery unit of claim 9 wherein the digital input code bus signals do not include one or more least significant bits of the content of the digital accumulator.

11. The clock recovery unit of claim 10 wherein the digital phase tracking circuit further includes a rotational phase shifter to shift the phase of the output clock signal to generate the shifted output clock signal, wherein the rate of phase shifting is controlled by the digital input code bus signals.

12. A clock recovery unit comprising:
a phase locked loop receiving a transmitted data signal and generating an output clock signal, wherein the phase locked loop circuit comprises a phase detector which is adapted to compare a phase of the transmitted data signal to a phase of the output clock signal in order to generate a phase difference signal, and wherein the phase locked loop further includes a summer which sums the phase difference signal and the frequency difference signal to generate a combined phase difference signal; and a frequency detection circuit receiving the output clock signal and a reference clock signal and generating a frequency difference signal provided to the phase locked loop circuit, wherein the frequency detection circuit comprises a digital phase tracking circuit to shift the output clock signal in discrete steps from 0 to 360 degrees to generate a shifted variable clock signal, wherein the digital phase tracking circuit further includes a phase comparator receiving the reference clock signal and the shifted output clock signal, the phase comparator producing a digital logic value output signal, and a digital accumulator to receive the digital logic value output signal, the digital accumulator counting down when the digital logic value output signal has a value of 0 and counting up when the digital logic value output signal has a value of 1, wherein the digital accumulator provides digital input code bus signals, which include at least some of a content of the digital accumulator, wherein the digital input code bus signals do not include one or more least significant bits of the content of the digital accumulator, wherein the digital phase tracking circuit further includes a rotational phase shifter to shift the phase of the output clock signal to generate the shifted output clock signal, wherein the rate of phase shifting is controlled by the digital input code bus signals, wherein the phase locked loop circuit uses the frequency difference signal to establish a phase lock between the transmitted data signal and the output clock signal, and wherein the digital phase tracking circuit further includes a divider to receive the shifted output clock signal and to divide the frequency of the shifted output clock signal to generate a divided shifted output clock signal, wherein the a phase comparator compares the reference clock signal with the divided shifted variable clock signal to generate the digital logic value output signal.

13. A method of recovering a clock signal from a transmitted data signal comprising:
receiving the transmitted data signal;
generating a variable clock signal using the transmitted data signal;
phase shifting the variable clock signal based on a digital input code, the digital input code being generated in part by dividing up the frequency of the shifted variable clock signal, and
comparing the shifted variable clock signal with a reference clock signal to generate a phase difference signal, wherein the phase difference signal is used during generation of the variable clock signal, and the variable clock signal is used as the recovered clock signal.

14. The method of recovering a clock signal of claim 13 wherein generating the variable clock signal includes:
a) comparing the transmitted data signal with a variable clock signal feedback to generate a data phase difference signal;
b) summing the data phase difference signal with the phase difference signal into a combined difference signal;
c) filtering the combined difference signal to generate a control voltage signal; and d) using the control voltage signal to adjust an oscillation frequency of a voltage controlled oscillator.

15. The method of recovering a clock signal of claim 14 wherein generating the variable clock signal further includes repeating a), b), c) and d) continuously.

16. The method of recovering a clock signal of claim 15 wherein filtering the combined difference signal includes low pass filtering.

17. The method of recovering a clock signal of claim 16 wherein phase shifting the variable clock signal includes:
   a) phase shifting the variable clock signal into a plurality of clock signals, each of the plurality of clock signals having a phase different from each other;
   b) combining the plurality of clock signals to generate the shifted variable clock signal;
   c) comparing the shifted variable clock signal with the reference clock signal to generate a clock phase difference signal;
   d) using the clock phase difference signal to update a content of a digital accumulator; and
   e) using the content of the digital accumulator as the digital input code to control a shifting rate of the variable clock signal.

18. The method of recovering a clock signal of claim 17 wherein a), b), c), d) and e) are repeated continuously.

19. The method of recovering a clock signal of claim 18 wherein generating the variable clock signal further includes glitch suppressing the phase difference signal prior to summing it with the data phase difference signal.

20. A clock recovery unit comprising:
   a phase locked loop receiving a transmitted data signal and generating an output clock signal;
   a digital phase tracking circuit coupled to the phase locked loop receiving a reference clock signal and the output clock signal to generate a shifted variable clock signal;
   a phase/frequency detector coupled to the digital phase tracking circuit comparing the reference clock signal to the shifted variable clock signal to generate a frequency difference signal; and
   a glitch suppressor coupled to the phase/frequency detector receiving the frequency difference signal from the phase/frequency detector and suppressing the frequency difference signal when the frequency difference signal is small.

21. The clock recovery unit of claim 20 wherein the digital phase tracking circuit comprises a phase comparator receiving the reference clock signal and a scaled version of the shifted variable clock signal and generating a digital logic value output signal by comparing the reference clock signal with the scaled version of the shifted variable clock signal.

22. The clock recovery unit of claim 21 wherein the digital logic value output signal comprises a value of 1 to indicate a need for the shifted variable clock signal to speed up and a value of 0 to indicate a need for the shifted variable clock signal to slow down.

23. The clock recovery unit of claim 21 wherein the digital phase tracking circuit further comprises a digital accumulator coupled to the phase comparator receiving the digital logic value output signal and interprets the digital logic value output signal to provide digital input code bus signals, which include at least some of a content of the digital accumulator.

24. The clock recovery unit of claim 23 wherein at least one of the most significant bits (MSBs) of the digital accumulator are provided as the digital input code bus signals.

25. The clock recovery unit of claim 24 wherein at least one of the least significant bits (LSBs) of the digital accumulator are dropped when providing the digital input code bus signals.

26. The clock recovery unit of claim 25 wherein the rate of phase shifting is controlled by the number of bits in the digital accumulator.

27. The clock recovery unit of claim 23 wherein the digital phase tracking circuit further comprises a rotational phase shifter coupled to the digital accumulator receiving the digital input code bus signals and shifting the output clock signal based on the digital input code bus signals to generate the shifted variable clock signal.

28. The clock recovery unit of claim 27 wherein the size of the digital input code bus signals depend on the number of states of the rotational phase shifter.

29. The clock recovery unit of claim 27 wherein the rotational shifter shifts the phase of the output clock signal in discrete amounts from 0 to 360 degrees.

30. The clock recovery unit of claim 23 wherein the digital phase tracking circuit further comprises a divider coupled to the rotational phase shifter receiving the shifted variable clock signal and dividing the frequency of the shifted variable clock signal to provide the scaled version of the shifted variable output clock to the phase comparator.

31. The clock recovery unit of claim 20 wherein the phase locked loop comprises a phase detector adapted to receive and compare a phase of the transmitted data signal and a phase of the output clock signal to generate a phase difference signal.

32. The clock recovery unit of claim 31 wherein the phase locked loop comprises a summer coupled to the phase detector summing the phase difference signal and the frequency difference signal to generate a combined phase difference signal.

33. The clock recovery unit of claim 32 wherein the phase locked loop comprises a loop filter coupled to the summer low pass filtering the combined phase difference signal.

34. The clock recover unit of claim 33 wherein the phase locked loop comprises a voltage controlled oscillator coupled to the loop files generating the output clock signal based on the filtered combined phase difference signal.

35. The clock recovery unit of claim 30 further comprising a control circuit switching off the frequency detection circuit when the frequency difference signal is small.

36. The clock recovery unit of claim 35 further comprising a control circuit switching on the frequency detection circuit when the frequency of the shifted variable clock signal is sufficiently far apart from the frequency of the reference clock.

37. The clock recovery unit of claim 36 further comprising a control circuit detecting whether the phase locked loop is locked.

38. A clock recovery unit comprising:
   means for generating a variable clock signal using a transmitted data signal;
   means for phase shifting the variable clock signal based on a digital input code, the digital input code being generated in part by dividing up the frequency of the shifted variable clock signal;
   means for comparing the shifted variable clock signal with a reference clock signal to generate a frequency difference signal; and means for combining the frequency difference signal with a phase difference signal, where the combined difference signals are used to generate the variable clock signal, and the variable clock signal is used as a recovered clock signal.

39. The clock recovery unit of claim 38, wherein the means for phase shifting the variable clock signal comprises:

means for phase shifting the variable clock signal into a plurality of clock signals, each of the plurality of clock signals having a phase different from each other;

means for comparing each of the plurality of clock signals with the reference clock signal to generate a clock phase difference signal; and means for controlling the rate of the phase shifting based on the clock phase difference signal.

40. The clock recovery unit of claim 38 further comprising means for suppressing the frequency difference signal when the frequency difference signal is small.

* * * * *

UNITED STATES PATENT AND TRADEMARK OFFICE
CERTIFICATE OF CORRECTION

PATENT NO. : 6,738,922 B1  Page 1 of 1
DATED : May 18, 2004
INVENTOR(S) : Greg Warwar et al.

It is certified that error appears in the above-identified patent and that said Letters Patent is hereby corrected as shown below:

Column 5,
Line 54, "30" should be deleted

Column 6,
Line 55, "art" should be deleted

Column 10,
Line 39, "the a" should be -- the --
Line 51, "," should be -- ; --

Column 12,
Line 45, "30" should be -- 20 --
Lines 46-47, change "frequency detection circuit" to -- phase/frequency detector --
Lines 49-50, change "frequency detection circuit" to -- phase/frequency detector --

Signed and Sealed this

Twenty-first Day of December, 2004

JON W. DUDAS
*Director of the United States Patent and Trademark Office*